(12) United States Patent
Chiang et al.

(10) Patent No.: US 9,692,426 B2
(45) Date of Patent: Jun. 27, 2017

(54) PHASE LOCKED LOOP SYSTEM WITH BANDWIDTH MEASUREMENT AND CALIBRATION

(71) Applicant: Advanced Micro Devices, Inc., Sunnyvale, CA (US)

(72) Inventors: Meei-Ling Chiang, Cupertino, CA (US); Boon-Aik Ang, Los Altos, CA (US); Dennis Fischette, Jr., Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 498 days.

(21) Appl. No.: 13/887,485

(22) Filed: May 6, 2013

(65) Prior Publication Data
US 2014/0327477 A1    Nov. 6, 2014

(51) Int. Cl.
*H03L 7/06*    (2006.01)
*H03L 7/08*    (2006.01)

(52) U.S. Cl.
CPC ..................... *H03L 7/08* (2013.01)

(58) Field of Classification Search
CPC ......... H03L 7/0891; H03L 7/18; H03L 7/093; H03L 7/087; H03L 7/10
USPC .................................. 327/156, 158
See application file for complete search history.

(56) References Cited

U.S. PATENT DOCUMENTS 7,042,252 B2 *   5/2006   Galloway et al. .............. 327/16

OTHER PUBLICATIONS

D. M. Fischette, A. L. S. Loke, R. J. DeSantis and G. R. Talbot, "An Embedded All-Digital Circuit to Measure PLL Response", IEEE Journal of Solid-State Circuits, vol. 45, No. 8, Aug. 2010, pp. 1492 to 1503.
M. Ferriss, J. Plouchart, A. Natarajan, A. Rylyakov, B. Parker, A. Babakhani, S. Yaldiz, B. Sadhu, A. Valdes-Garcia, J. Tierno and D. Friedman, "An integral path self-calibration scheme for a 20.1-26.7GHz dual-loop PLL in 32nm SOI CMOS", IEEE 2012 Symposium on VLSI Circuits Digest of Technical Papers, pp. 176 to 177.

\* cited by examiner

*Primary Examiner* — Lincoln Donovan
*Assistant Examiner* — Diana J Cheng
(74) *Attorney, Agent, or Firm* — Polansky & Associates, P.L.L.C.; Paul J. Polansky

(57) ABSTRACT

A phase locked loop (PLL) system includes a PLL and a calibration circuit. The PLL has a reference clock input, a voltage controlled oscillator (VCO) clock output, and a feedback clock output. The calibration circuit provides a reference clock signal to the reference clock input of the PLL, induces first and second phase disturbances between the reference clock signal and a feedback clock signal, measures respective first and second zero crossing times of a phase error between the reference clock signal and the feedback clock signal, and estimates a bandwidth of the PLL in response to an average of the first and second zero crossing times.

20 Claims, 5 Drawing Sheets

400

PHASE LOCKED LOOP SYSTEM WITH BANDWIDTH MEASUREMENT AND CALIBRATION

FIELD

This disclosure relates generally to electronic circuits, and more specifically to phase locked loop (PLL) systems.

BACKGROUND

Various communications protocols that support high-speed links use a PLL as a frequency synthesizer and also as a noise filter. For example, the PCI Express (PCIE) standard defines specifications for PLLs implemented in transmitter and receiver bus agents for such communications. The PCIE standard is an extension of the PCI standard that uses existing PCI programming concepts. A typical PLL includes a phase-frequency detector and a closed loop feedback divider. The feedback divider has a particular set of divider values based on a desired PLL output clock signal frequency. The phase-frequency detector compares the phase of a reference clock input signal to an internal PLL feedback clock signal. The phase-frequency detector also outputs a signal to adjust the frequency of the PLL clock output in a direction that eliminates a phase difference between the reference clock signal and the feedback clock signal. When the phases and frequencies of the reference clock signal and the PLL clock output signal are aligned, the PLL output signal is "locked" to the reference clock signal.

As communication standards such as the PCIE standard continue to specify increasing data rates, the specifications of the associated transmitter and receiver PLLs become increasingly difficult to meet. For example, historically the PCIE standard has doubled the PCIE bandwidth for each major revision (generally every 3-4 years).

Certain known PLL implementations include adjustment circuits to tune parameters of the PLL. However, when process, voltage, and temperature variations are taken into account, generally the adjustment circuits have difficulty meeting the stricter PLL specifications. As an example of one such specification, many communication standards continue to tighten the amount of jitter that is allowed to propagate from the reference clock signal to the PLL output clock signal. In particular, the PCIE standard defines PLL bandwidth and peaking values for both the transmitter and receiver, placing an upper limit on the amount of reference clock jitter that the transmitter propagates to the receiver over the high speed link. When both the transmitter and receiver PLLs operate within "right sized" bandwidth and peaking values, the receiver is able to perform proper clock and data recovery, and maintain compatibility with the remote transmitter on the other side of the link.

Figure 1:
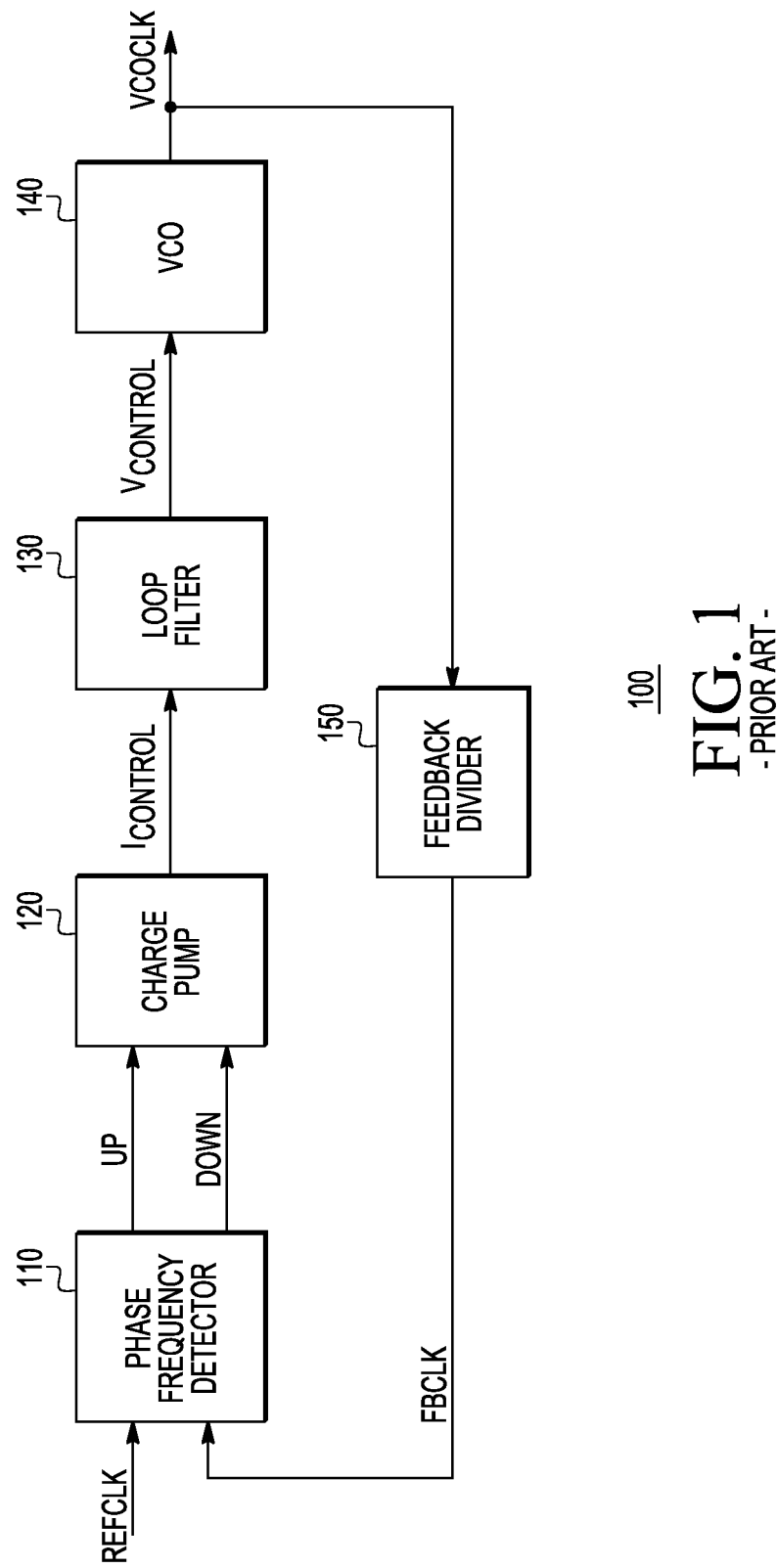
FIG. 1 illustrates in block diagram form a PLL known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A PLL generally includes a phase/frequency detector, a charge pump, a loop filter, a voltage controlled oscillator (VCO), and a feedback divider. A PLL system as disclosed below includes a PLL and a calibration circuit. The calibration circuit provides a reference clock signal to the reference clock input of the PLL. The calibration circuit also induces first and second phase disturbances between the reference clock signal and a feedback clock signal, and measures respective first and second zero crossing times of a phase error between the reference clock signal and the feedback clock signal. The calibration circuit further estimates a bandwidth of the PLL in response to the first and second zero crossing times. In some embodiments, the first and second zero crossing times have substantially the same magnitude but opposite polarities, and the calibration circuit estimates the bandwidth of the PLL in response to an average of the first and second zero crossing times of the phase error. By averaging the first and second zero crossing times of the phase error, phase errors introduced by a phase advance are "averaged out" with the phase errors introduced by a phase retard.

In some embodiments, a PLL system includes a calibration circuit that includes a reference clock multiplexer having a first input for receiving a reference clock signal, a second input for receiving a phase control signal, and an output coupled to the reference clock input of the phase locked loop. In some embodiments, the calibration circuit further includes a loop measurement circuit having a first input for receiving the reference clock signal, a second input connected to the output of the reference clock multiplexer, a third input connected to the feedback clock output of the PLL, a fourth input coupled to the VCO clock output of the PLL, and a fifth input for receiving a calibration control signal, a first output for providing a measured bandwidth signal and a second output for providing a peaking signal.

In some embodiments, a PLL system includes a calibration circuit for improving a bandwidth measurement accuracy and meeting a low peaking value. The calibration circuit introduces a certain static phase error and induces a larger peaking value of the PLL. The calibration circuit further scales the bandwidth estimate by a certain number based on the larger peaking value.

Thus, a PLL system as described herein can accurately measure bandwidth and peaking values of the PLL. Based on the measurements, the PLL system can further "fine tune", i.e., calibrate, the bandwidth and peaking values to meet or exceed challenging specifications of the receive and transmit bus agents of high-speed systems, within only a small magnitude of error. Also, the calibration circuit can calibrate the PLL for desired operation in harsh environments affected by challenging process, voltage, and temperature variations.

FIG. 1 illustrates in block diagram form a PLL 100 known in the prior art. For the example shown in FIG. 1, PLL 100 generally includes a phase/frequency detector 110, a charge pump 120, a loop filter 130, a VCO 140, and a feedback divider 150.

Phase/frequency detector 110 has a first input to receive a reference clock signal labeled "REFCLK", a second input to receive a clock signal labeled "FBCLK", a first output to provide a signal labeled "UP", and a second output to provide a signal labeled "DOWN". Charge pump 120 has a first input connected to the first output of phase/frequency detector 110 to receive the UP signal, a second input connected to the second output of phase/frequency detector 110 to receive the DOWN signal, and an output to provide a signal labeled "$I_{CONTROL}$". Loop filter 130 has an input to receive the $I_{CONTROL}$ signal and an output to provide a signal labeled "$V_{CONTROL}$". VCO 140 has an input connected to the output of loop filter 130 to receive the $V_{CONTROL}$ signal and an output to provide a clock signal labeled "VCOCLK". Feedback divider 150 has an input connected to the output of VCO 140 to receive the VCOCLK signal and an output connected to the second input of phase/frequency detector 110 to provide the FBCLK signal.

In operation, PLL 100 uses negative feedback using self regulating circuitry to reduce fluctuations in the VCOCLK signal. When PLL 100 achieves a locked state, the phase of the VCOCLK signal is locked to the phase of the REFCLK signal. PLL 100 provides the VCOCLK signal at an output clock frequency ($f_{VCOCLK}$) associated with the input clock frequency ($f_{REFCLK}$) based on:

$$f_{VCOCLK} = f_{REFCLK} * N$$

where feedback divider 150 has divider circuitry based on a divider ratio of 1/N. A particular set of divider values is based on a desired $f_{VCOCLK}$, electrical limitations, loop stability, and jitter performance of PLL 100.

Phase/frequency detector 110 monitors and compares the phase of the REFCLK signal and the FBCLK signal, and provides UP and DOWN output signals to remove a phase error between the REFCLK signal and the FBCLK signal. For example, if phase/frequency detector 110 detects an early rising edge of the REFCLK signal in relation to the FBCLK signal, phase/frequency detector 110 corrects the phase error by providing UP signal pulses to speed up $f_{VCOCLK}$. Alternately, if phase/frequency detector 110 detects a late rising edge of the REFCLK signal (or an early falling edge) in relation to the FBCLK signal, phase/frequency detector 110 corrects the phase error by providing DOWN signal pulses to slow down $f_{VCOCLK}$.

Charge pump 120 converts the UP and DOWN signal digital error pulses to provide the $I_{CONTROL}$ signal as an analog error current. $I_{CONTROL}$ charges a filter capacitor in loop filter 130, where the stored charge is proportional to the pulse width of the corresponding UP and DOWN signals. Loop filter 130 integrates the analog error current by charging the filter capacitor to provide $V_{CONTROL}$ as a control voltage to VCO 140. Loop filter 130 also includes a resistor, or a set of resistors, and a capacitor, or a set of capacitors, to set the cutoff frequency of loop filter 130.

VCO 140 is an oscillator that provides $f_{VCOCLK}$ (proportional to $V_{CONTROL}$. For example, VCO 140 provides $f_{VCOCLK}$ in the 1.0-5.0 GHz range, in response to the REFCLK signal having a $f_{REFCLK}$ in the 100 MHz range. VCO 140 also provides the VCOCLK signal as an input to feedback divider 150, which outputs the FBCLK signal by dividing the VCOCLK signal by a loop divider value N. Typically, for stability of the VCOCLK signal, feedback divider 150 is capable of providing a higher frequency FBCLK signal than a corresponding VCOCLK signal frequency.

A PLL has a characteristic bandwidth and peaking that define its response to jitter at the remote end. Bandwidth and peaking of a PLL can be measured by introducing a phase change in FBCLK and observing the response of the PLL, which will be discussed next.

Figure 2:
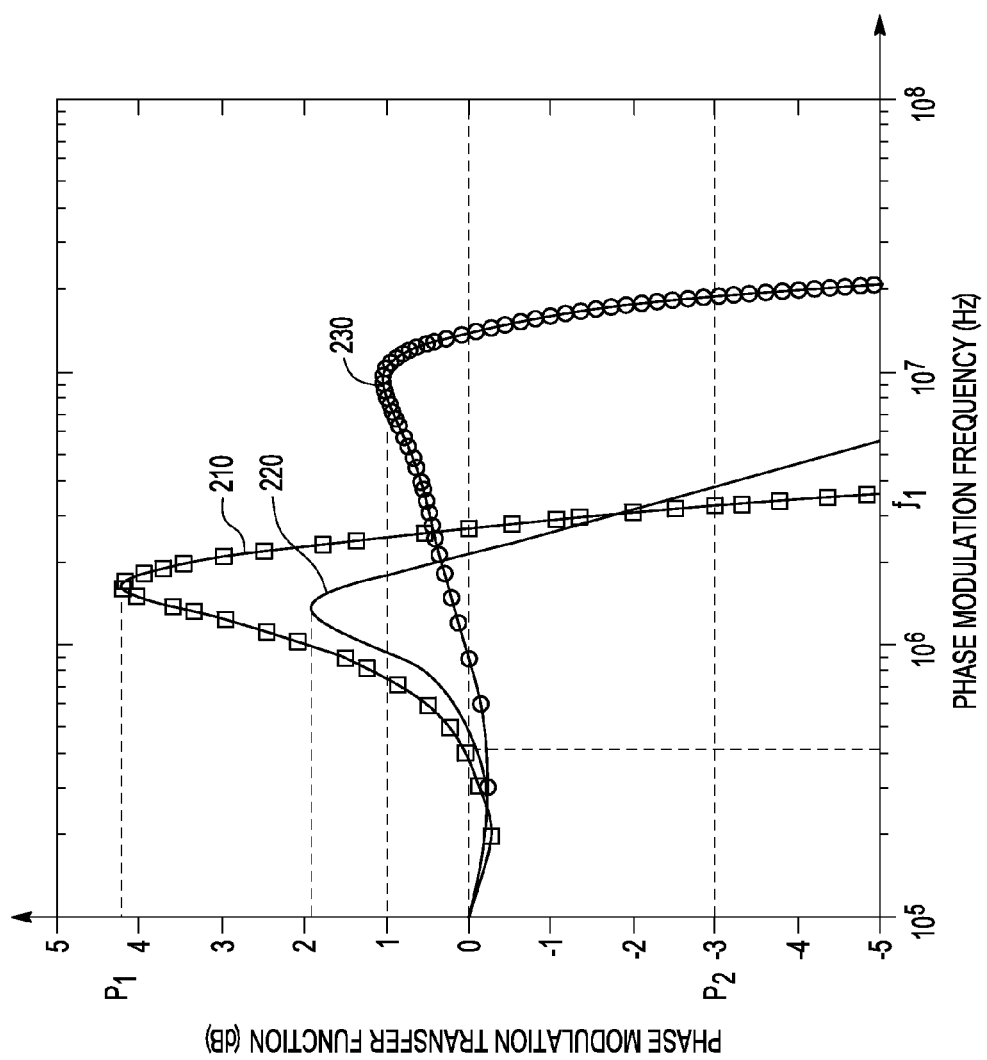
FIG. 2 illustrates a graph of a frequency response characteristic of a PLL such as the PLL of FIG. 1.

FIG. 2 illustrates a graph 200 of a frequency response characteristic of a PLL such as PLL 100 of FIG. 1. Example waveforms 210, 220, and 230 shown in FIG. 2 represent three frequency responses of PLL 100 using different loop parameters.

The horizontal axis represents phase modulation frequency (f) of PLL 100 in hertz (Hz) from $10^5$ Hz, or 0.1 MHz (megahertz), to $10^8$ Hz, or 100 MHz, and the vertical axis represents a phase modulation transfer function in decibels (dB) of PLL 100 from 0 dB to 5 dB in the positive direction of the vertical axis, and from 0 dB to −5 dB in the negative direction of the vertical axis. A representative point of interest on the horizontal axis is at a phase modulation frequency of about 3.5 MHz labeled "$f_1$". Two representative points of interest on the vertical axis are at about 4.5 dB labeled "$P_1$", and at a value of −3 dB labeled "$P_2$".

The bandwidth of PLL 100 is generally defined as the frequency where PLL 100 begins to lose lock with the REFCLK signal, and is indicated for each of waveforms 210, 220, and 230, by the −3 dB point ($P_2$) on the vertical axis of graph 200. A particular bandwidth corresponds to the phase error, settling time, and jitter tracking capability of PLL 100. Bandwidth is a measure of the ability of PLL 100 to track the REFCLK signal and the associated jitter of the REFCLK signal.

"Peaking" refers to the maximum value, in dB, of the phase modulation transfer function along the vertical axis. Higher peaking is undesirable from a jitter perspective since PLL 100 amplifies phase modulation around the peaking frequency but can be beneficial to reduce step response time. Waveform 210 represents relatively low bandwidth ($f_1$=about 3.5 MHz) and high peaking ($P_1$=about 4.5 dB). In contrast, waveform 230 represents relatively high bandwidth and low peaking Waveform 220 represents relatively low bandwidth (about 3.5 MHz) and low peaking (about 2 dB), and meets the bandwidth and peaking specifications defined by the PCIE 3.0 specification for an 8.0 Gb/s data rate.

When PLL 100 operates as represented by waveform 210, PLL 100 generally filters out more jitter of the REFCLK signal compared to waveform 230 because it filters out more of the higher frequency reference input noise. However PLL 100 typically takes a longer time to lock. When PLL 100 operates as represented by waveform 230, PLL 100 generally passes more jitter from the REFCLK signal to the VCOCLK signal because it filters out less of the higher frequency reference input noise. However PLL 100 typically takes a shorter time to lock. Thus, a PLL having right sized bandwidth and peaking is desired.

Figure 3:
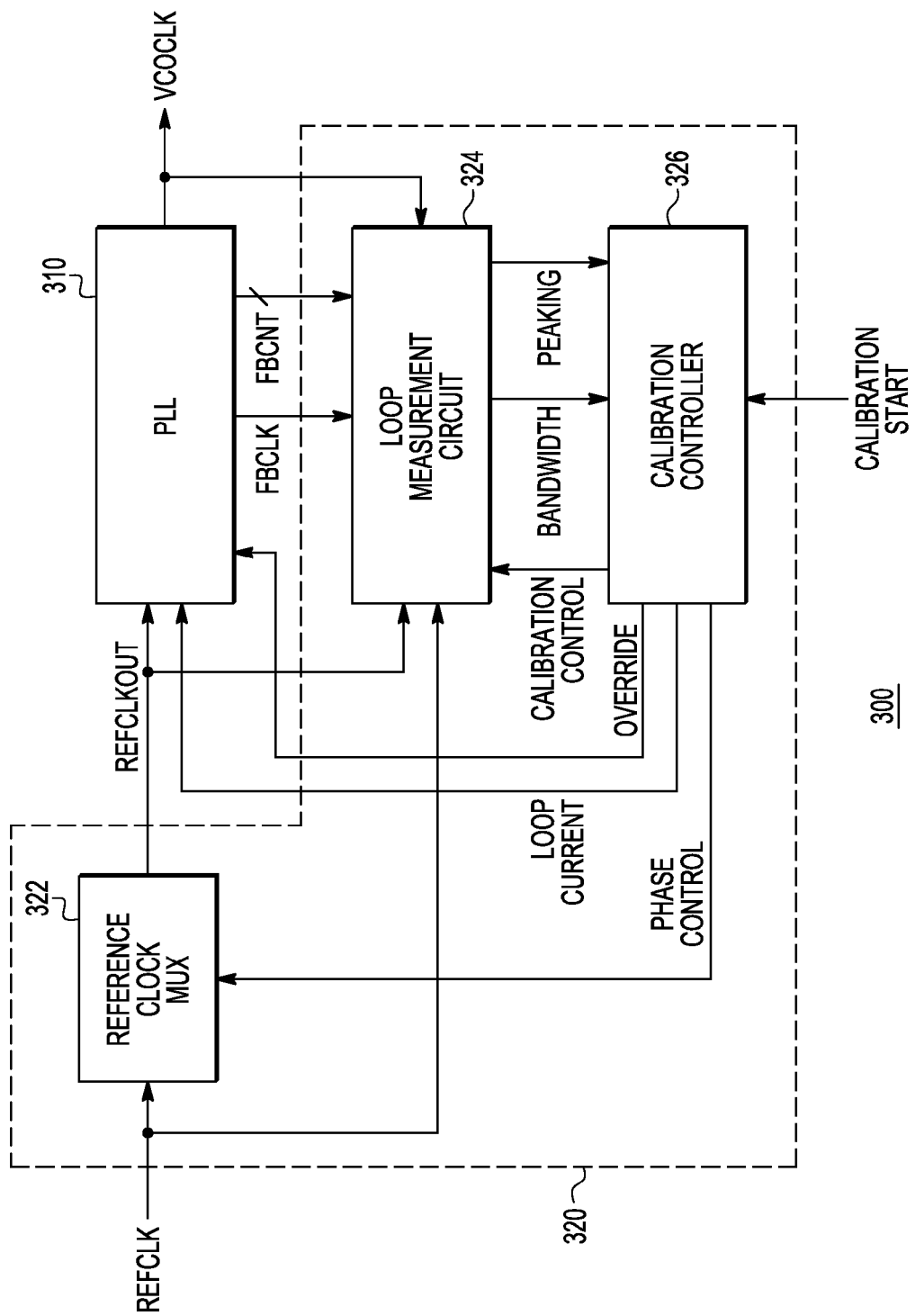
FIG. 3 illustrates in block diagram form a PLL system according to some embodiments.

FIG. 3 illustrates in block diagram form a PLL system 300 according to some embodiments. For the example shown in FIG. 3, PLL system 300 generally includes a PLL 310, and a calibration circuit 320. PLL 310 has a first input to receive a clock signal labeled "REFCLKOUT", a second input to receive a signal labeled "LOOP CURRENT", a third input to receive a signal labeled "OVERRIDE", a first output to provide the FBCLK signal, a second output to provide a set of feedback count signals labeled "FBCNT", and a third VCO clock output to provide the VCOCLK signal.

Calibration circuit 320 includes a reference clock multiplexer (MUX) 322, a loop measurement circuit 324, and a calibration controller 326. Reference clock multiplexer 322 has a first input to receive the REFCLK signal, a second input to receive a multiplexer select signal labeled "PHASE CONTROL", and an output connected to the first input of PLL 310 to provide the REFCLKOUT signal. Loop measurement circuit 324 has a first input connected to the output of reference clock multiplexer 322 to receive the REFCLKOUT signal, a second input to receive the REFCLK signal, a third input to receive a signal labeled "CALIBRATION CONTROL", a fourth input connected to the first output of PLL 310 to receive the FBCLK signal, a fifth input connected to the second output of PLL 310 to receive the FBCNT signal, a sixth input connected to the third output of PLL 310 to receive the VCOCLK signal, a first output to provide a signal labeled "BANDWIDTH", and a second output to provide a signal labeled "PEAKING". Calibration controller 326 has a first input connected to the first output of loop measurement circuit 324 to receive the BANDWIDTH signal, a second input connected to the second output of loop measurement circuit 324 to receive the PEAKING signal, a third input to receive a calibration start command signal labeled "CALIBRATION START", a first output connected to the second input of PLL 310 to provide the LOOP CURRENT signal, a second output connected to the third input of PLL 310 to provide the OVERRIDE signal, a third output connected to the second input of reference clock multiplexer 322 to provide the PHASE CONTROL signal, and a fourth output connected to the third input of loop measurement circuit 324 to provide the CALIBRATION CONTROL signal.

In operation, PLL system 300 provides calibration circuit 320 to meet the bandwidth and peaking specifications of advanced revisions of the PCIE standard, for example, PCIE 3.0 as summarized in TABLE I:

TABLE I

| Revision of the PCIE Standard | Supported Data Rate | Bandwidth, Peaking | PCIE PLL VCOCLK frequency ($f_{VCOCLK}$) for and Receiver Transmitter Output Clock and Receiver Frequency | PCIE Transmitter |
|---|---|---|---|---|
| PCIE 1.0 | 2.5 Gb/s | 3~22 MHz, 3 dB | 2.5/2.5 GHz | 1.25/1.25 GHz |
| PCIE 2.0 | 5.0 Gb/s | 5~16 MHz, 1 dB or 8~16 MHz, 3 dB | 2.5/2.5 GHz | 2.5/2.5 GHz |
| PCIE 3.0 | 8.0 Gb/s | 2~4 MHz, 2 dB or 2~5 MHz, 1 dB | 4.0/8.0 GHz | 4.0/8.0 GHz |

As discussed above for PLL 100, the bandwidth of PLL 310 is also generally defined as the frequency where PLL 310 begins to lose lock with the REFCLK signal. The bandwidth of PLL 310 is proportional to the charge pump current, the VCO gain, and the loop filter resistor value. In particular:

$$BW \propto \frac{Icp * Kvco * R}{N} \quad [1]$$

where Icp is the charge pump current, $K_{VCO}$ is the VCO gain, R is the loop filter resistor value, and N is the feedback divider ratio that is generally determined by the VCO frequency divided by the frequency of the REFCLK signal.

Calibration controller 326 generally calibrates the bandwidth of PLL 310 by providing a parameter tuning signal based on one or more of the parameters of Equation [1], such as the charge pump current, the VCO gain, and the loop filter resistor value. In the illustrated embodiment, calibration controller 326 provides a parameter tuning signal in the form of the LOOP CURRENT (Icp) signal to the tuning input of PLL 310 to calibrate various loop parameters, for example, the closed-loop bandwidth and corresponding peaking values. Calibration controller 326 advantageously adjusts the bandwidth of PLL 310 with finer resolution based on the ability to more precisely adjust charge pump current, and charge pump current being less susceptible to process, voltage, and temperature variations than the other parameters, In some embodiments, calibration controller 326 provides one or more other parameter tuning signals to PLL 310, for example, the parameters discussed above. Thus, calibration controller 326 has the capability to selectively calibrate bandwidth by providing each one or combinations of multiple tuning parameters.

Calibration controller 326 is responsive to the CALIBRATION START signal to begin bandwidth and peaking measurement of PLL 310, and subsequent calibration. In response, calibration controller 326 provides the PHASE CONTROL signal to reference clock multiplexer 322 to induce a phase disturbance of the REFCLK signal. For example, calibration controller 326 can reverse the REFCLK signal polarity after a falling edge so that a rising edge is provided to PLL 310 0.5 cycles early. In response, PLL 310 initially speeds up to reduce the phase error. However, when the induced phase error is approaching zero, PLL 310 is running too fast, so PLL 310 adjusts to run slower to compensate for the phase disturbance. Eventually PLL 310 relocks, and the bandwidth is related to the relocking time. Likewise calibration controller 326 can reverse the REFCLK signal polarity after a rising edge so that a rising edge is provided to PLL 310 0.5 cycles late. In response, PLL 310 initially slows down to reduce the phase error. However, when the induced phase error is approaching zero, PLL 310 is running too slow, so PLL 310 adjusts to run faster to compensate for the phase disturbance. Eventually PLL 310 relocks, and the bandwidth is again related to the relocking time.

Reference clock multiplexer 322 provides the phase modulated REFCLK signal as the REFCLKOUT signal to PLL 310 in response to a change in the PHASE CONTROL signal. In some embodiments, PLL 310 counts edges of the REFCLKOUT signal from the time calibration controller 326 provides the PHASE CONTROL signal to reference clock multiplexer 322, to a zero crossing time of the phase error. During this time, PLL 310 stores a count of a number of edges of the REFCLKOUT signal, since this count is tightly related to the inverse of the bandwidth of PLL 310, measured at the −3 dB point of the phase modulation transfer function. Based on counting edges of the REFCLKOUT signal, PLL 310 provides the FBCNT signal from the feedback count output to loop measurement circuit 324.

In some embodiments, instead of, or in addition to providing the PHASE CONTROL signal, calibration controller 326 provides the OVERRIDE signal to PLL 310 to induce first and second phase disturbances between the REFCLK signal and the FBCLK signal. In particular, calibration controller 326 provides the OVERRIDE signal to feedback divider 150 to force one cycle overrides of the feedback divider. In one example, feedback divider 150 operates normally when dividing by 100. Calibration controller 326 provides the OVERRIDE signal to induce a 10% phase advance to feedback divider 150 to force a divide by 90 for one cycle. Also, calibration controller 326 provides the OVERRIDE signal to induce a 10% phase retard to feedback divider 150 to force a divide by 110 for one cycle.

During measurement and calibration of the closed-loop bandwidth and corresponding peaking values, calibration controller 326 provides the CALIBRATION CONTROL signal to loop measurement circuit 324. In response, loop measurement circuit 324 compares the REFCLK signal edges to the FBCLK signal edges, to determine when the edges are aligned. Note that since calibration controller 326 initially introduced a static phase error, the clock edges of the REFCLK signal and the FBCLK signal will have a constant phase error between them, even after PLL 310 has locked. Static phase error is generally defined as a constant phase error between the REFCLK and FBCLK signals, even after PLL 310 has achieved lock. For an ideal PLL, the REFCLK and FBCLK edges are "perfectly" aligned. However, after achieving lock, a PLL such as PLL 310 will lock with an average difference in time between the phases of the REFCLK signal and the FBCLK signal in response to factors such as jitter. This average difference in time is referred to as a static phase offset, or a static phase error. During measurement of the bandwidth and peaking of PLL 310, loop measurement circuit 324 selectively provides the measured BANDWIDTH signal and the PEAKING signal to calibration controller 326, based on ongoing measurements that compare the phase and frequency relationships between the REFCLK, REFCLKOUT, FBCLK, and VCOCLK signals.

Calibration circuit 320 of PLL system 300 induces phase disturbances between the REFCLK signal and a FBCLK signal, and measures zero crossing times of a phase error between the REFCLK signal and the FBCLK signal. In some embodiments, PLL system 300 includes loop measurement circuit 324 to receive a FBCNT signal from PLL 310 based on counting REFCLK edges from an induced phase disturbance to a zero crossing time of the phase error. These initial concepts will be expanded on and discussed further below. Also, additional concepts will be discussed below such as the capability of calibration circuit 320 to induce first and second phase disturbances between the REFCLK signal and the FBCLK signal, measuring respective first and second zero crossing times of a phase error between the REFCLK signal and the FBCLK signal, and estimating a bandwidth of PLL 310 in response to an average of the first and second zero crossing times.

Figure 4:
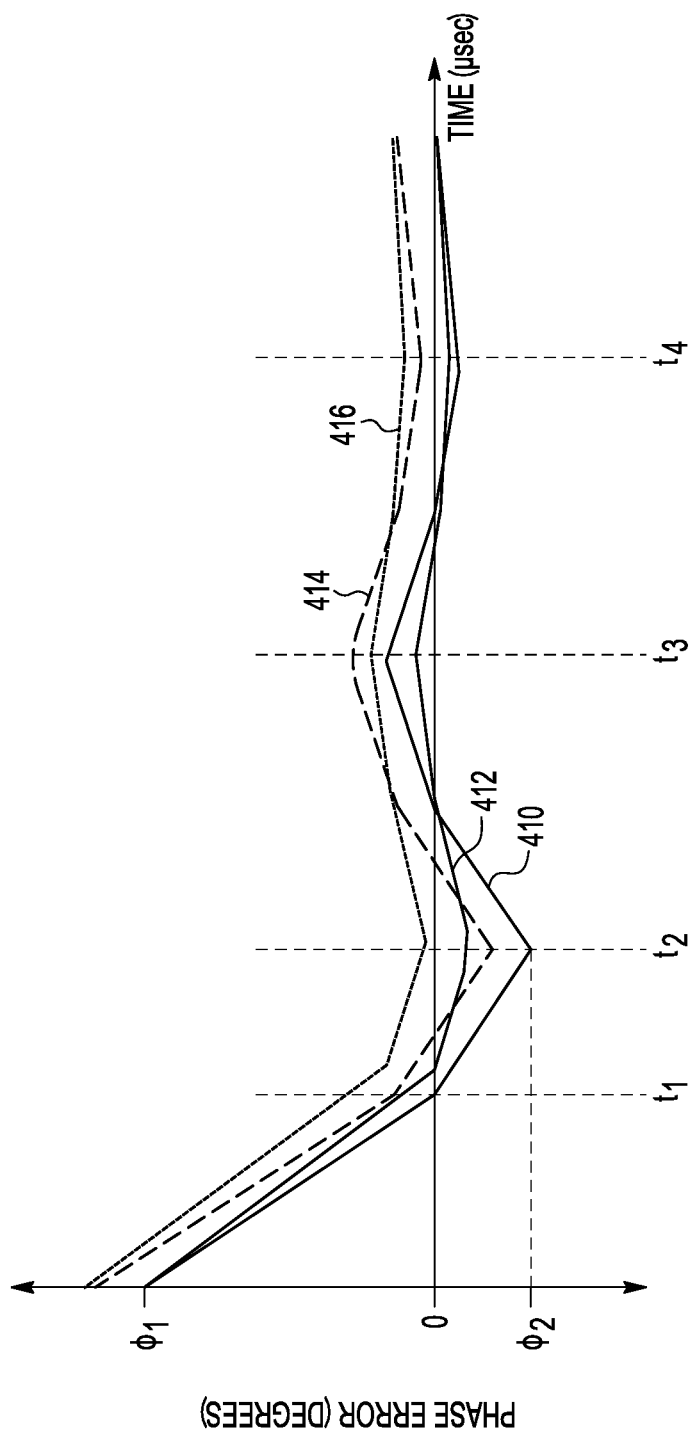
FIG. 4 illustrates a timing diagram of induced phase errors of the PLL of FIG. 3 according to some embodiments.

FIG. 4 illustrates a timing diagram 400 of induced phase errors of PLL 310 of FIG. 3 according to some embodiments. The horizontal axis represents time in microseconds (pee), and the vertical axis represents phase error in degrees, where reference clock multiplexer 322 induces a phase error labeled "PHASE ERROR" at the vertical axis. Timing diagram 400 illustrates four waveforms of interest, waveforms 410, 412, 414, and 416. The horizontal axis illustrates four particular time points of interest labeled "$t_1$", "$t_2$", "$t_3$", and "$t_4$", and the vertical axis illustrates two phase errors labeled "$\phi_1$" in the positive direction of the vertical axis, and "$\phi_2$" in the negative direction of the vertical axis.

In operation, waveform 410 represents a step response of PLL 310 having a moderate peaking value and no static phase error. Calibration controller 326 induces no additional static phase error. Loop measurement circuit 324 measures the BANDWIDTH signal and the PEAKING signal of PLL 310 based on:

(1) time $t_1$ of the horizontal axis: the time to the first change in sign, or zero crossing of the phase error;
(2) time $t_2$ of the horizontal axis: the time to the maximum phase overshoot; and
(3) phase $\phi_2$ on the vertical axis: the phase error at time $t_2$ (the maximum phase overshoot).

As PLL 310 reduces the phase error over the time period from $t_1$ to $t_4$ on the horizontal axis, loop measurement circuit 324 determines whether PLL 310 is sufficiently overdamped or underdamped for accurate bandwidth measurement, by determining changes in sign of the phase shift error until PLL 310 locks (time periods $t_3$ and $t_4$ on the horizontal axis).

Waveform 412 represents a step response of PLL 310 having about the same bandwidth as represented by waveform 410, but a lower maximum phase overshoot. PLL 310 is again assumed to have no static phase error. Loop measurement circuit 324 measures the time to the first zero crossing of the phase error, which is longer than for waveform 410. However, the measured bandwidth has a higher error component than waveform 410 based on a lower peaking value.

Waveform 414 represents a step response of PLL 310 having a moderate peaking value and a non-zero static phase error. Calibration controller 326 induces a moderate phase error at time $t_0$. Loop measurement circuit 324 measures the time to the first zero crossing of the phase error. However, the measured bandwidth also has an additional error component since calibration controller 326 has induced a moderate static phase error.

Waveform 416 represents a step response of PLL 310 having a low peaking value and a non-zero static phase error. Calibration controller 326 induces a phase error at time $t_0$. Note that loop measurement circuit 324 can no longer measure a time to the first zero crossing of the phase error, based on the low peaking value and the size of the static phase error. In order to overcome this condition, calibration controller 326 changes the loop parameters to increase peaking, effectively making waveform 416 look more like waveform 414 and to force a zero crossing. Then calibration controller 326 scales the value of the measured zero crossing time to account for the increased peaking.

Expanding on the discussion for FIG. 4 above, PLL system 300 can further induce first and second phase disturbances between the reference clock signal and the feedback clock signal. PLL system 300 further measures respective first and second zero crossing times of a phase error between the REFCLK signal and the FBCLK signal. Calibration circuit 320 further estimates a bandwidth of PLL 310 in response to an average of the first and second zero crossing times of the phase error. By averaging the first and second zero crossing times of the phase error, phase errors introduced by a phase advance are averaged out with the phase errors introduced by a phase retard.

In some embodiments, loop measurement circuit 324 receives the FBCNT signal based on counting reference clock edges from an induced phase disturbance to a zero crossing time of the phase error. In some embodiments, calibration circuit 320 induces the first phase disturbance having a certain phase difference, and induces the second phase disturbance having the certain phase difference. In some embodiments, calibration circuit 320 induces the first phase disturbance of a first polarity including a phase retard, and induces the second phase disturbance of a second polarity including a phase advance.

Figure 5:
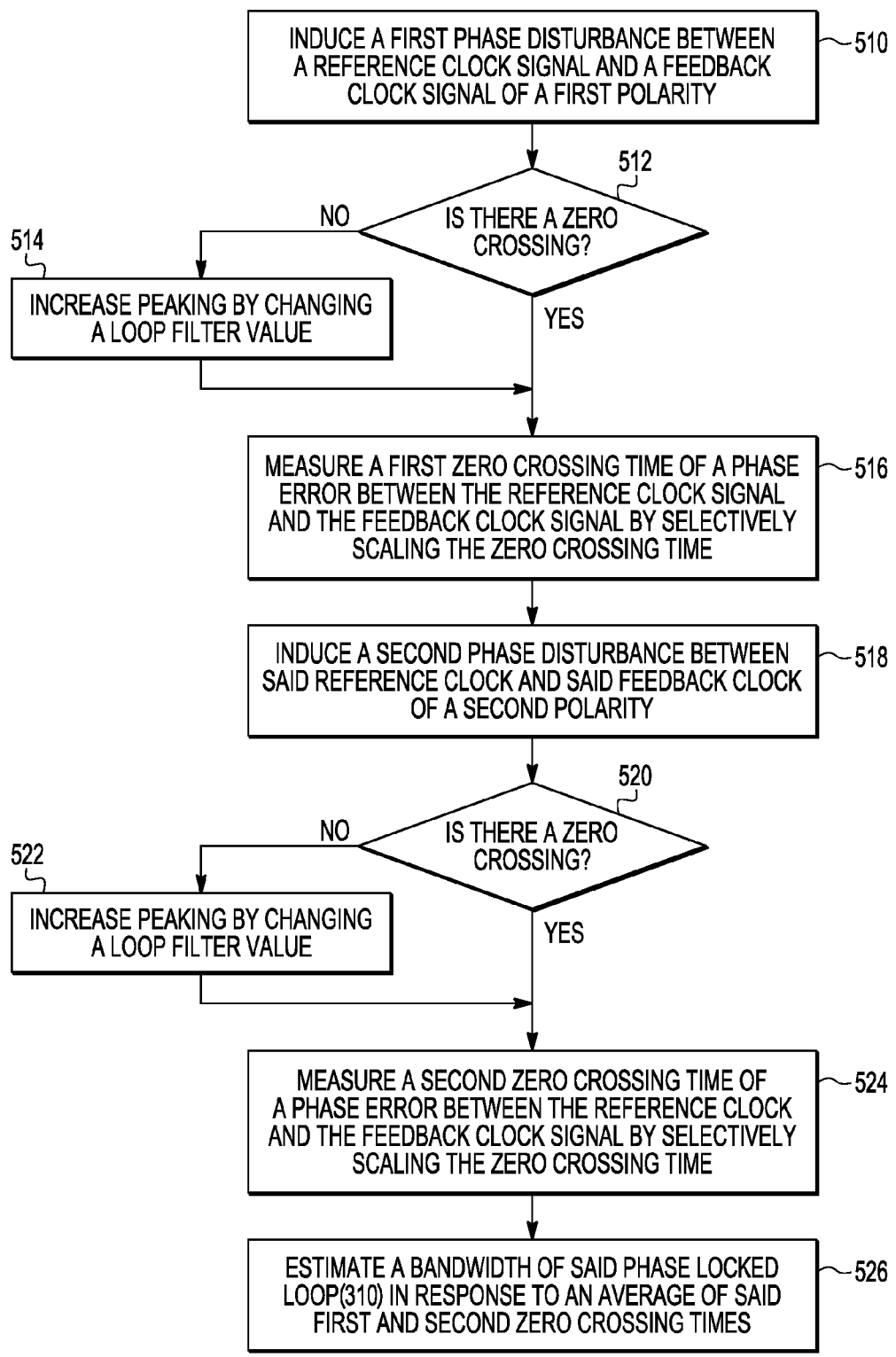
FIG. 5 illustrates a flow diagram of a method for calibrating phase errors of a PLL such as the PLL of FIG. 3 according to some embodiments.

FIG. 5 illustrates a flow diagram of a method for calibrating phase errors of a PLL such as the PLL of FIG. 3 according to some embodiments. Action box 510 includes inducing a first phase disturbance between a reference clock signal and a feedback clock signal of a first polarity. In some embodiments, decision box 512 determines if there is a zero crossing of a phase error between the reference clock and the feedback clock. If not, action box 514 includes increasing a peaking value of the PLL by changing a loop filter value, for example, a charge pump current, a VCO gain, or a loop filter resistor value. If so, the flow continues to action box 516 that includes measuring a first zero crossing time of a phase error between the reference clock and the feedback clock signal by selectively scaling the zero crossing time. Action box 518 includes inducing a second phase disturbance between the reference clock and the feedback clock of a second polarity. In some embodiments, decision box 520 determines if there is a zero crossing of a phase error between the reference clock and the feedback clock. If not, action box 522 includes increasing a peaking value of the PLL by changing a loop filter value. If so, the flow continues to action box 524 that includes measuring a second crossing time of a phase error between the reference clock and the feedback clock signal by selectively scaling the zero crossing time. Action box 526 includes estimating a bandwidth of the PLL in response to an average of the first and second zero crossing times.

In some embodiments, inducing the first phase disturbance includes inducing the first phase disturbance having a certain phase difference, and inducing the second phase disturbance includes inducing the second phase disturbance having the certain phase difference. In some embodiments, inducing the first phase disturbance of the first polarity includes inducing a phase retard, and inducing the second phase disturbance of the second polarity includes inducing a phase advance. In some embodiments, inducing the first phase disturbance of the first polarity is further characterized as locking the feedback clock signal to the reference clock signal; and inducing a first phase disturbance between a reference clock signal and a feedback clock signal of a first polarity.

In some embodiments, measuring a first zero crossing time of a phase error is further characterized as measuring a first zero crossing time of a phase error between the reference clock and the feedback clock signal, storing a first count of reference clock edges counted from the first phase disturbance to the first zero crossing time of the phase error, and re-locking the feedback clock signal to the reference clock signal. In some embodiments, measuring a second zero crossing time of a phase error is further characterized as measuring a second zero crossing time of a phase error between the reference clock and the feedback clock signal, and storing a second count of reference clock edges counted from the second phase disturbance to the second zero crossing time of the phase error. In some embodiments, estimating a bandwidth of the PLL is further in response to an average of the first count of reference clock edges and the second count of reference clock edges. In some embodiments, whether the difference of the first count of the reference clock edges and the second count of the reference clock edges is greater than a certain number of reference clock edges is determined, and the peaking value of the phase locked loop is increased if the difference is greater than the certain number of reference clock edges.

Thus, a PLL system as described herein can accurately measure bandwidth and peaking values of the PLL. Based on the measurements, the PLL system can further fine tune, and calibrate, bandwidth and peaking values to meet or exceed challenging specifications of the receive and transmit bus agents of high-speed systems, within only a small magnitude of error. Also, the calibration circuit can calibrate the PLL for desired operation in harsh environments affected by challenging process, voltage, and temperature variations.

The functions of PLL system 300 of FIG. 3 may be implemented with various combinations of hardware and software. For example, some functions of loop measurement circuit 324 and calibration controller 326 may be determined by an operating system, firmware, or software drivers, and stored as a table in non-volatile memory. Some of the software components may be stored in a computer readable storage medium for execution by at least one processor. Moreover the method illustrated in FIG. 5 may also be governed by instructions that are stored in a computer readable storage medium and that are executed by at least one processor. Each of the operations shown in FIG. 5 may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

Moreover, the circuits of FIG. 3 may be described or represented by a computer accessible data structure in the form of a database or other data structure which can be read by a program and used, directly or indirectly, to fabricate integrated circuits with the circuits of FIG. 3. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising integrated circuits with the circuits of FIG. 3. The netlist may then be placed and routed to produce a data set describing geometric shapes to be applied to masks. The masks may then be used in various semiconductor fabrication steps to produce integrated circuits of FIG. 3. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, in the illustrated embodiment of FIG. 3, PLL system 300 includes loop measurement circuit 324 and calibration controller 326 to measure and calibrate bandwidth and peaking parameters. PLL system 300 could include fuse bits to adjust the charge pump current of PLL 310 to calibrate the bandwidth of PLL 310 within 2.0 megahertz and 5.0 megahertz and to calibrate the peaking of PLL 310 within 1.0 decibels and 2.0 decibels, compatible with the PCIE 3.0 specification.

Any combination of PLL 310, reference clock multiplexer 322, loop measurement circuit 324, and calibration controller 326, respectively, could each use a common circuit design or different circuit designs. Also, any combination of PLL 310, reference clock multiplexer 322, loop measurement circuit 324, and calibration controller 326 could be formed on a single integrated circuit or could be formed on multiple integrated circuits.

Accordingly, it is intended by the appended claims to cover all modifications of the disclosed embodiments that fall within the scope of the disclosed embodiments.

What is claimed is:
1. A phase locked loop system comprising:
   a phase locked loop having a reference clock input, a voltage controlled oscillator (VCO) clock output, and a feedback clock output; and a calibration circuit for providing a reference clock signal to said reference clock input of said phase locked loop, inducing first and second phase disturbances between said reference clock signal and a feedback clock signal, measuring respective first and second zero crossing times of a phase error between said reference clock signal and said feedback clock signal, and estimating a bandwidth of said phase locked loop in response to said first and second zero crossing times.

2. The phase locked loop system of claim 1 wherein said first and second phase disturbances have substantially the same magnitude but opposite polarities, and said calibration circuit estimates said bandwidth of said phase locked loop in response to an average of said first and second zero crossing times.

3. The phase locked loop system of claim 1 wherein said calibration circuit further increases a peaking value of said phase locked loop in response to an absence of a zero crossing.

4. The phase locked loop system of claim 3 wherein said calibration circuit further scales said bandwidth estimate based on said increased peaking value.

5. The phase locked loop system of claim 1 wherein said phase locked loop further has a tuning input for receiving a parameter tuning signal and a feedback count output for providing a feedback count signal.

6. The phase locked loop system of claim 5 wherein said parameter tuning signal comprises at least one of a loop current signal, a loop filter resistor signal, and a VCO gain signal.

7. The phase locked loop system of claim 1 wherein said calibration circuit comprises:
a reference clock multiplexer having a first input for receiving said reference clock signal, a second input for receiving a phase control signal, and an output coupled to said reference clock input of said phase locked loop.

8. The phase locked loop system of claim 1 wherein said calibration circuit induces said first and second phase disturbances by temporarily changing a loop divider value of said phase locked loop.

9. A phase locked loop system comprising:
a phase locked loop having a reference clock input, a tuning input for receiving a parameter tuning signal, a voltage controlled oscillator (VCO) clock output, and a feedback clock output;
a reference clock multiplexer having a first input for receiving a reference clock signal, a second input for receiving a phase control signal, and an output coupled to said reference clock input of said phase locked loop;
a loop measurement circuit having a first input for receiving said reference clock signal, a second input coupled to said output of said reference clock multiplexer, a third input coupled to said feedback clock output of said phase locked loop, a fourth input coupled to said VCO clock output of said phase locked loop, and a fifth input for receiving a calibration control signal, a first output for providing a measured bandwidth signal and a second output for providing a peaking signal; and
a calibration controller having a first input for receiving a calibration start command, second and third inputs respectively coupled to said first and second outputs of said loop measurement circuit, a first output for providing said phase control signal, a second output coupled to said tuning input of said phase locked loop for providing said parameter tuning signal, and a third output for providing said calibration control signal.

10. The phase locked loop system of claim 9 wherein said loop measurement circuit provides at least one of said bandwidth signal and said peaking signal in response to said calibration control signal.

11. The phase locked loop system of claim 9 wherein said parameter tuning signal comprises at least one of a loop current signal, a loop filter resistor signal, and a VCO gain signal.

12. The phase locked loop system of claim 9 wherein said calibration controller further has a fourth output for providing an override signal, and said phase locked loop further has an override input for receiving the override signal, and induces phase disturbance between the reference clock signal in response to the override signal by changing a feedback divider value.

13. The phase locked loop system of claim 9 wherein said calibration controller provides said parameter tuning signal for calibrating a peaking value of said phase locked loop.

14. A method of measuring a bandwidth of a phase locked loop comprising:
inducing a first phase disturbance between a reference clock signal and a feedback clock signal;
measuring a first zero crossing time of a phase error between the reference clock signal and the feedback clock signal by selectively scaling the zero crossing time;
inducing a second phase disturbance between said reference clock and said feedback clock;
measuring a second zero crossing time of said phase error between said reference clock signal and said feedback clock signal by selectively scaling the zero crossing time; and
estimating the bandwidth of said phase locked loop in response to said first and second zero crossing times.

15. The method of claim 14 wherein:
said inducing said first phase disturbance comprises inducing said first phase disturbance having a predetermined phase difference and a first polarity;
said inducing said second phase disturbance comprises inducing said second phase disturbance having said predetermined phase difference and a second polarity; and
said estimating comprises estimating said bandwidth of said phase locked loop in response to an average of said first and second zero crossing times.

16. The method of claim 14 further comprising locking said feedback clock signal to said reference clock signal before inducing said first phase disturbance.

17. The method of claim 16 wherein:
said measuring said first zero crossing time of said phase error comprises storing a first count of reference clock edges counted from said first phase disturbance to said first zero crossing time of said phase error;
said measuring said second zero crossing time comprises storing a second count of reference clock edges counted from said second phase disturbance to said second zero crossing time of said phase error; and
said estimating said bandwidth of said phase locked loop comprises estimating in response to an average of said first count of reference clock edges and said second count of reference clock edges.

18. The method of claim 17 further comprising:
determining whether a difference of said first count of said reference clock edges and said second count of said reference clock edges is greater than a predetermined number of reference clock edges; and increasing a peaking value of the phase locked loop if said difference is greater than said predetermined number of reference clock edges.

19. The method of claim 18 further comprising:
scaling said zero crossing time in response to said increasing.

20. The method of claim 19 further comprising:
determining whether there is a zero crossing of said phase error between the reference clock and the feedback clock signal;
increasing said peaking value of said phase locked loop if there is no zero crossing before performing said measuring; and
scaling said zero crossing time in response to said increasing.

* * * * *